United States Patent
Hong

(10) Patent No.: US 9,520,484 B2
(45) Date of Patent: Dec. 13, 2016

(54) METHOD FOR FORMING SEMICONDUCTOR NANOWIRE TRANSISTORS

(71) Applicant: SEMICONDUCTOR MANUFACTURING INTERNATIONAL (SHANGHAI) CORPORATION, Shanghai (CN)

(72) Inventor: Zhongshan Hong, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/921,919

(22) Filed: Oct. 23, 2015

(65) Prior Publication Data

US 2016/0118482 A1    Apr. 28, 2016

(30) Foreign Application Priority Data

Oct. 24, 2014    (CN) .......................... 2014 1 0572401

(51) Int. Cl.
*H01L 21/00*    (2006.01)
*H01L 29/66*    (2006.01)
(Continued)

(52) U.S. Cl.
CPC ......... *H01L 29/66795* (2013.01); *B82Y 10/00* (2013.01); *H01L 29/0673* (2013.01); *H01L 29/1033* (2013.01); *H01L 29/6653* (2013.01); *H01L 29/6656* (2013.01); *H01L 29/66439* (2013.01); *H01L 29/66545* (2013.01); *H01L 29/775* (2013.01); *H01L 21/3065* (2013.01);
(Continued)

(58) Field of Classification Search
CPC .................. H01L 29/66795; H01L 29/66545; H01L 21/3083; H01L 29/6656; H01L 21/31051; H01L 21/32139; H01L 29/6653; H01L 21/02529; H01L 21/02532; H01L 21/02538; H01L 21/2115; H01L 21/02164; H01L 29/0669; H01L 29/0673; H01L 29/1033; H01L 29/66439; H01L 29/775; H01L 21/30604; H01L 21/3065; H01L 21/32134; H01L 29/66068; B82Y 10/00
USPC ........................................................ 438/157
See application file for complete search history.

(56) References Cited

U.S. PATENT DOCUMENTS

| | | | | |
|---|---|---|---|---|
| 2013/0178019 A1* | 7/2013 | Bangsaruntip | .... | H01L 29/42392 438/149 |
| 2015/0303303 A1* | 10/2015 | Lauer | .................. | H01L 29/1054 257/347 |
| 2016/0027870 A1* | 1/2016 | Cheng | ................ | H01L 29/0673 257/347 |

* cited by examiner

*Primary Examiner* — Thanh T Nguyen
(74) *Attorney, Agent, or Firm* — Kilpatrick Townsend and Stockton LLP

(57) ABSTRACT

A method for forming a semiconductor device includes forming a semiconductor substrate having at least one fin structure on an insulator on a substrate. The fin structure includes a semiconductor layer overlying a sacrificial layer. The method also includes forming a patterned dummy gate on the substrate, forming a first spacer on both sides of the dummy gate, and using the dummy gate and the first spacer as a mask to remove a portion of the semiconductor layer and the sacrificial layer. Then the sacrificial layer is etched to form recessed regions on both sides of the sacrificial layer, and a second spacer is formed to cover both sides of the sacrificial layer and expose both sides of the semiconductor layer. The method also includes performing epitaxial growth on both sides of the semiconductor layer to form source and drain regions.

16 Claims, 10 Drawing Sheets

(51) Int. Cl.
*B82Y 10/00* (2011.01)
*H01L 29/775* (2006.01)
*H01L 29/10* (2006.01)
H01L 21/3213 (2006.01)
H01L 29/06 (2006.01)
H01L 21/306 (2006.01)
H01L 21/3065 (2006.01)

(52) U.S. Cl.
CPC .... *H01L 21/30604* (2013.01); *H01L 21/32134* (2013.01); *H01L 21/32139* (2013.01); *H01L 29/0669* (2013.01); *H01L 29/66068* (2013.01)

METHOD FOR FORMING SEMICONDUCTOR NANOWIRE TRANSISTORS

CROSS-REFERENCES TO RELATED APPLICATIONS

This application claims priority to Chinese patent application No. 201410572401.4, filed on Oct. 24, 2014, the content of which is incorporated herein by reference in its entirety.

BACKGROUND OF THE INVENTION

The present invention relates to the field of semiconductor technology. Specifically, embodiments of the invention are directed to nanowire semiconductor device structures and manufacturing methods.

Currently, during the formation of the nanowire device, the material under the nanowire needs to be etched away. In conventional methods, this requires an isotropic etching process. But such an etching process makes it difficult to obtain good gate shape, such as flat gate morphology. It is especially difficult to maintain a good interface between the nanowire and the gate, which can impact the gate characteristics, and degrade device performance.

BRIEF SUMMARY OF THE INVENTION

The inventors have identified drawbacks in the conventional methods for forming nanowire devices, especially in gate patterning. Embodiments of the present invention provide a method for forming nanowire device that can provide a good interface between the nanowire and the gate structure.

According to some embodiments of the present invention, a method for forming a semiconductor device includes forming a semiconductor substrate having at least one fin structure on an insulator on a substrate. The fin structure includes a semiconductor layer overlying a sacrificial layer. The method also includes forming a patterned dummy gate on the substrate, forming a first spacer on both sides of the dummy gate, and using the dummy gate and the first spacer as a mask to remove a portion of the semiconductor layer and the sacrificial layer. Then the sacrificial layer is etched to form recessed regions on both sides of the sacrificial layer, and a second spacer is formed to cover both sides of the sacrificial layer and expose both sides of the semiconductor layer. The method also includes performing epitaxial growth on both sides of the semiconductor layer to form source and drain regions.

In some embodiments, the method also includes forming an interlayer dielectric around the source and the drain regions, planarizing the interlayer dielectric to expose the dummy gate, removing the dummy gate and the sacrificial layer, and forming a high K dielectric layer and a metal gate surrounding the remaining semiconductor layer.

In an embodiment, removing the dummy gate electrode and the sacrificial layer includes using isotropic dry etching to remove the dummy gate electrode and the sacrificial layer.

In an embodiment, removing the dummy gate electrode and the sacrificial layer includes using wet etching or dry etching to remove the dummy gate and a portion of the sacrificial layer, and using isotropic etching to remove the remaining sacrificial layer.

In an embodiment, the method also includes using hydrogen chloride gas at a temperature higher than 200° C. to remove the remaining sacrificial layer.

In an embodiment, the method also includes, before forming the patterned dummy gate, forming a dummy insulator on the fin structure.

In an embodiment, the dummy insulator includes an oxide material or a nitride material.

In an embodiment, forming the patterned dummy gate includes forming a dummy gate material layer on the substrate overlying the insulator and the fin structure, forming a patterned hard mask material on the dummy gate material layer, and using the hard mask as a mask, etching the dummy gate material to form the patterned dummy gate.

In an embodiment, the dummy gate comprises polysilicon or amorphous silicon.

In an embodiment, the hard mask comprises SiN, SiCN, SiC, or SiON.

In an embodiment, the lateral dimension of the sacrificial layer, after recessed regions are formed, is substantially the same as the lateral dimension of the dummy gate.

In an embodiment, the method also includes removing the first spacer before forming the second spacer.

In an embodiment, forming the fin structure includes forming the sacrificial layer on the substrate, forming the semiconductor layer on the sacrificial layer, forming a patterned mask on the semiconductor layer, and etching the semiconductor layer and the sacrificial layer to form at the fin structure.

In an embodiment, the sacrificial layer includes Si, Ge, or SiGe, and the semiconductor layer comprises Si, SiGe, Ge, or a group III-V compound.

In an embodiment, the source and drain regions comprise Si, SiGe, or SiC.

In an embodiment, the first spacer comprises silicon oxide or amorphous carbon.

The following description, together with the accompanying drawings, will provide further understanding of the nature and advantages of the claimed invention.

DETAILED DESCRIPTION OF THE INVENTION

Figure 1:
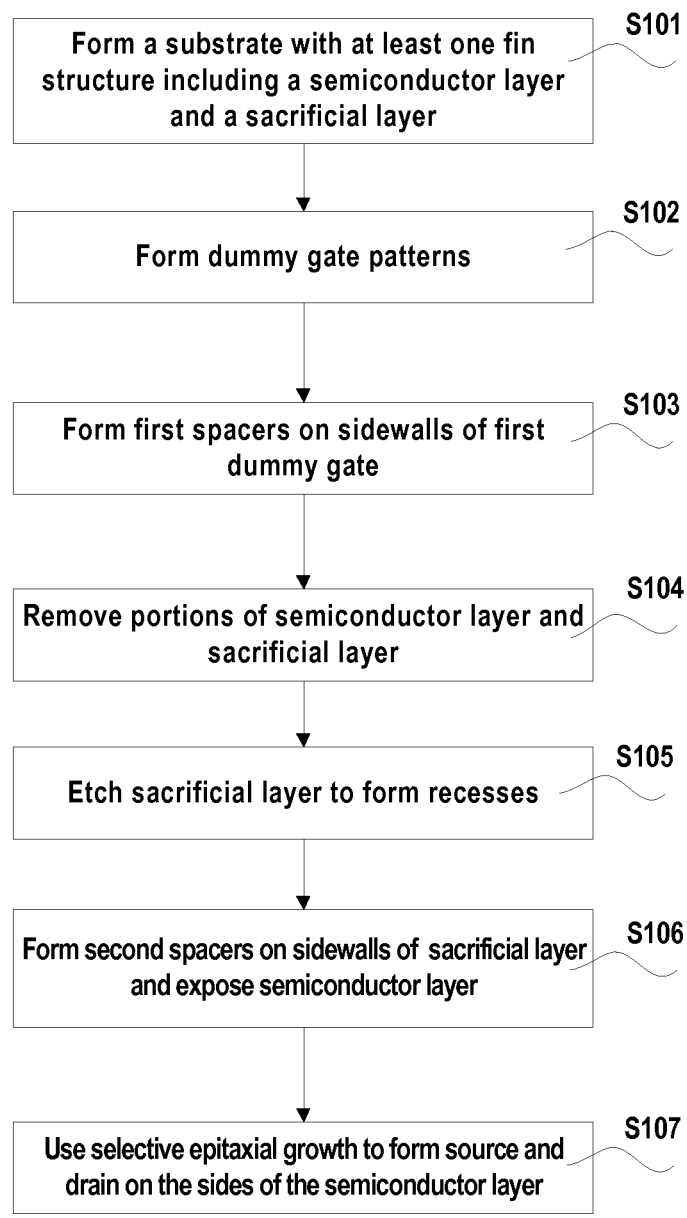
FIG. 1 is a simplified flow chart of a method for forming a semiconductor device according to an embodiment of the present invention.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the size of the various components shown in the drawings are not necessarily drawn in actual proportional relationship. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

FIG. 1 is a simplified flow chart of a method for forming a semiconductor device according to an embodiment of the present invention. The method will be described with reference to FIG. 1 and the device diagrams in FIGS. 2-14C. As shown in FIG. 1, the method includes the following steps:

S101: forming a semiconductor substrate having at least one fin structure on an insulator on a substrate, said fin structure including a semiconductor layer overlying a sacrificial layer;

S102: forming a patterned dummy gate on the substrate;

S103: forming a first spacer on both sides of the dummy gate;

S104: using the dummy gate and the first spacer as a mask, removing a portion of the semiconductor layer and the sacrificial layer;

S105: etching the sacrificial layer to form recessed regions on both sides of the sacrificial layer;

S106: forming a second spacer to cover both sides of the sacrificial layer and exposing both sides of the semiconductor layer; and S107: performing epitaxial growth on both sides of the semiconductor layer to form source and drain regions.

Figure 2:
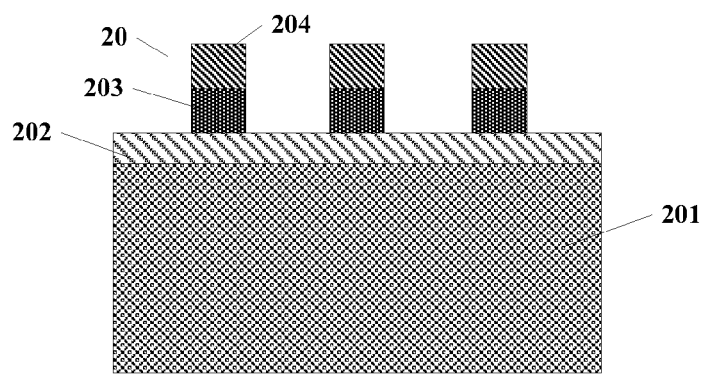
FIGS. 2-14C are cross-sectional view diagrams or top view diagrams illustrating a method for forming a semiconductor device according to embodiments of the present invention.

At step S101, as shown in FIG. 2, the intermediate device structure is a semiconductor substrate that includes a substrate 201, an insulator or dielectric layer 202 overlying substrate 201. One or more fin structures 20 include a sacrificial layer 203 formed on insulator layer 202 and a semiconductor layer 204 formed on sacrificial layer 203. Semiconductor layer 204 is also referred to as a channel layer. Semiconductor layer 204 which will be used to form a nanowire device, and can include silicon (Si), germanium (Ge), or silicon germanium (SiGe). Insulator 202 can be silicon oxide (SiO$_2$), and substrate 201 can be silicon. In embodiments of the invention, semiconductor substrate can include an SOI (silicon on insulator) region or a Si/SiGe fin structure on an SOI wafer. In FIG. 2, three fin structures are shown. Of course, those skilled in the art can appreciate that the above description is exemplary, and the substrate may also include any number of fin structures.

Figure 3:
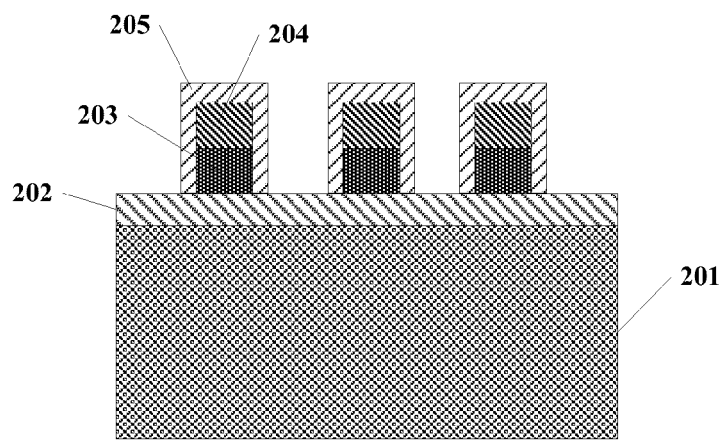
Figure 4:
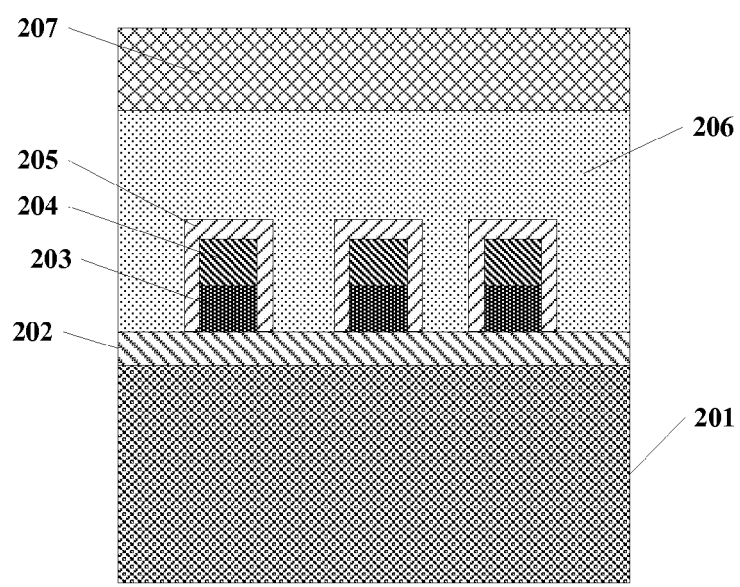
Figure 5A:
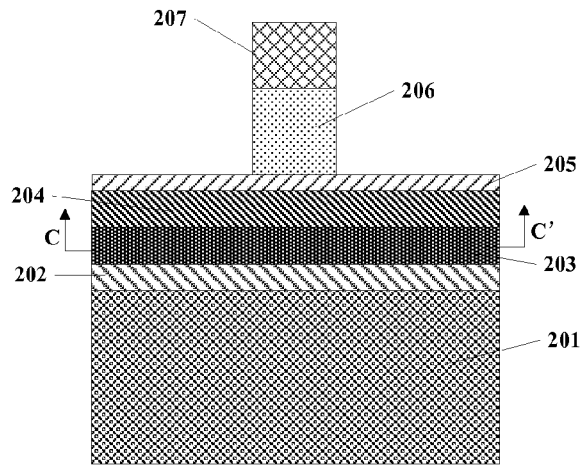
Figure 5B:
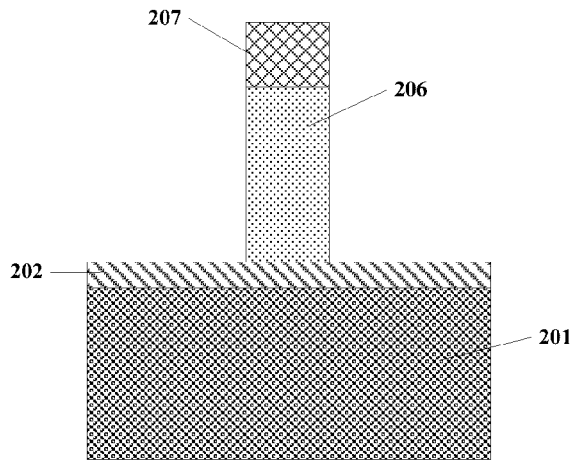
Figure 5C:
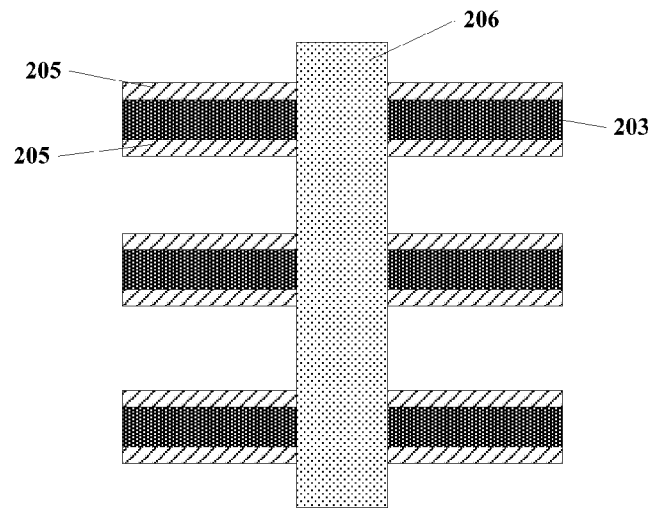
Figure 5D:
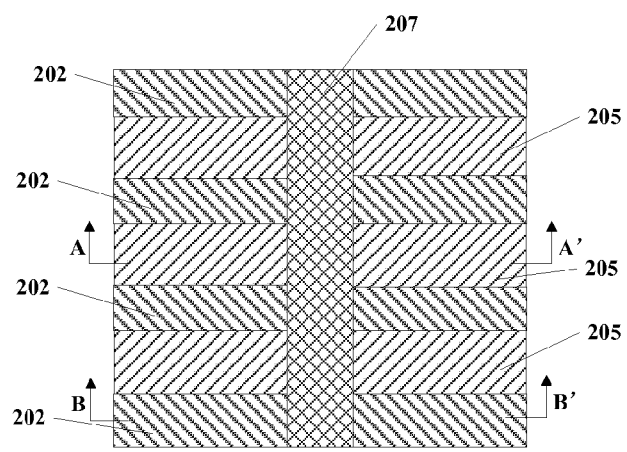
Figure 6A:
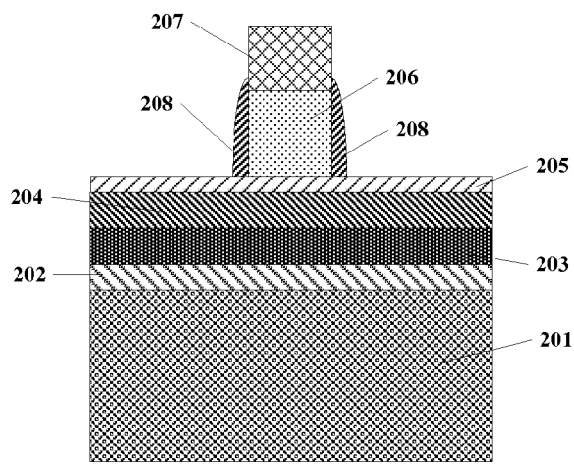
Figure 6B:
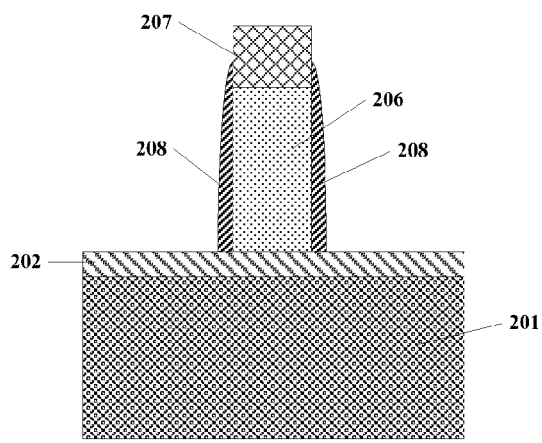
Figure 6C:
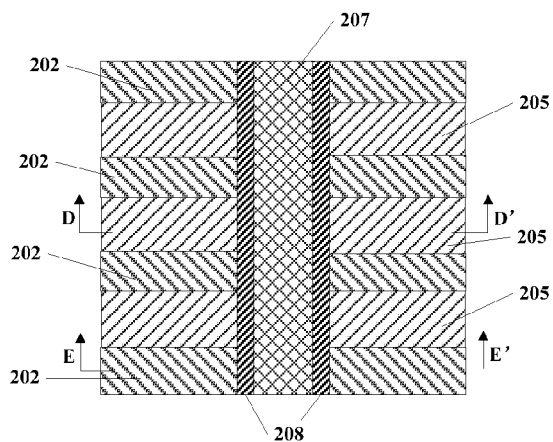

At step S102, a patterned dummy gate structure is formed. First, as shown in FIG. 3, an optional dummy dielectric layer 205 is formed overlying the fin structures. The dummy dielectric layer can include silicon oxides or silicon nitrides, and can be formed by deposition or thermal oxidation processes. In some embodiments, the dummy dielectric layer can be omitted. Next, as shown in FIG. 4, a dummy gate material layer 206, e.g., polysilicon or amorphous silicon, is formed overlying the fin structure, which may include dummy dielectric layer 205. A hard mask layer 207 is formed on the dummy gate material layer. The hard mask layer can include silicon nitride (SiN), Silicon carbon nitride (SiCN), silicon carbide (SiC), or silicon oxynitride (SiON). Next, the hard mask layer and the dummy gate material layer are patterned to form the patterned dummy gate structures as shown in FIGS. 5A and 5B. FIG. 5A is a cross-sectional view diagram illustrating the patterned dummy gate structure along a cut line extending through the fin structure. FIG. 5B is a cross-sectional view diagram illustrating the patterned dummy gate structure along a cut line extending through a region between two adjacent etched dummy gate structures. FIG. 5C is a top cross-sectional view diagram, along the direction of a line CC' in FIG. 5A, illustrating the patterned dummy gate layer on top of the fin structures. In FIG. 5C, the optional dummy dielectric layer 205 is removed from the top of the semiconductor layer 203 in this embodiment. FIG. 5D is a top view diagram illustrating the patterned dummy gate layer on top of the fin structures. In FIG. 5D, cut line AA' extends through a fin structure, and cut line BB' extends through a region between two adjacent fin structures. Thus, FIG. 5A is a cross-sectional view along the AA' direction, and FIG. 5B is a cross-sectional view along the BB'. In forming the patterned dummy gate structure, the patterning process can include photolithography and etching.

At step S103, a first spacer is formed on both sides of the dummy gate. The first spacer is shown as 208 in the cross-sectional views in FIGS. 6A and 6B, and the top view in FIG. 6C. The first spacer can include silicon oxide or amorphous carbon. The spacer can be formed using known processes, e.g. deposition and etch.

Figure 7A:
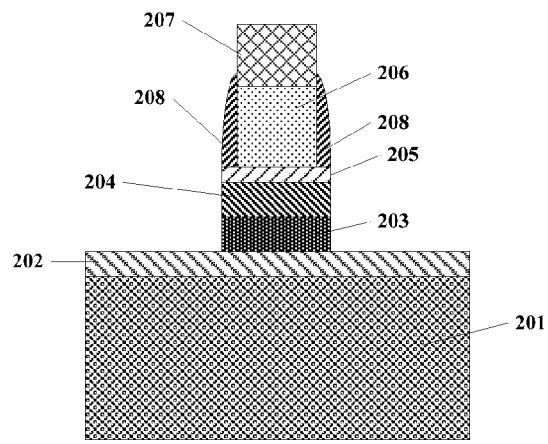
Figure 7B:
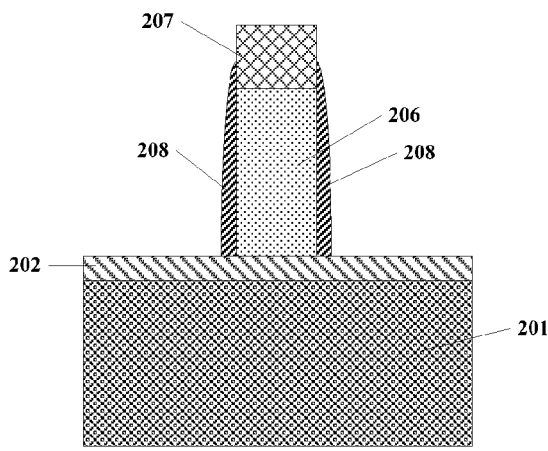

At step S104, using the dummy gate and the first spacer as a mask, a portion of semiconductor layer 204 and sacrificial layer 203 is removed. The resultant structure is shown in FIGS. 7A and 7B along the AA' and BB' directions as noted in FIG. 5D, respectively. Known etching processes can be used to etch semiconductor layer 204 and sacrificial layer 203. It can be seen in FIG. 7A that, after the etch, the remaining portions of semiconductor layer 204 and sacrificial layer 203 are substantially aligned with the dummy gate and spacers.

Figure 8A:
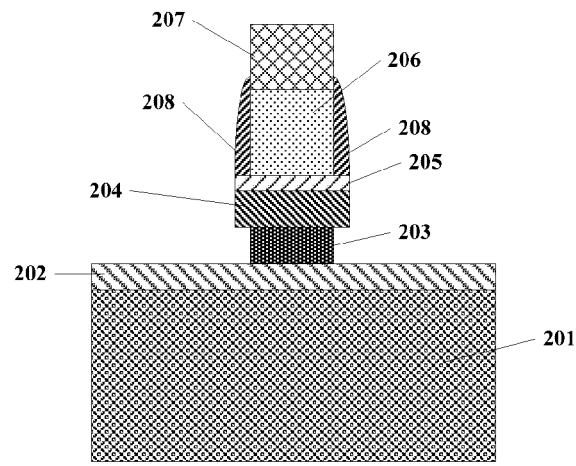
Figure 8B:
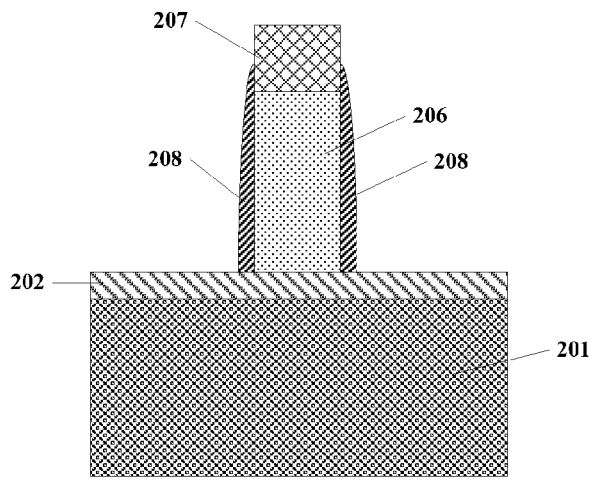

At step S105, the sacrificial layer 203 is etched to form recessed regions on both sides of the sacrificial layer. FIGS. 8A and 8B are cross-sectional views along the AA' and BB' directions as noted in FIG. 5D, respectively. As shown in FIG. 8A, sacrificial layer 203 is etched to form recesses on both sides. It can be seen that the lateral dimension of the remaining sacrificial layer 203 is smaller than the lateral dimension of semiconductor layer 204. Further, in some embodiments of the present invention, the lateral dimension of sacrificial layer 203 is substantially equal to the lateral dimension of the dummy gate 206. This design will improve the gate control in the formation of high dielectric constant dielectric and metal gate device to be completed subsequently. As described below, the sacrificial layer will be removed and replaced with the high dielectric constant dielectric and the metal gate. For example, the etching time can be selected to allow the lateral dimension of the remaining sacrificial layer 203 to be equal to the lateral dimension of dummy gate 206.

Figure 9A:
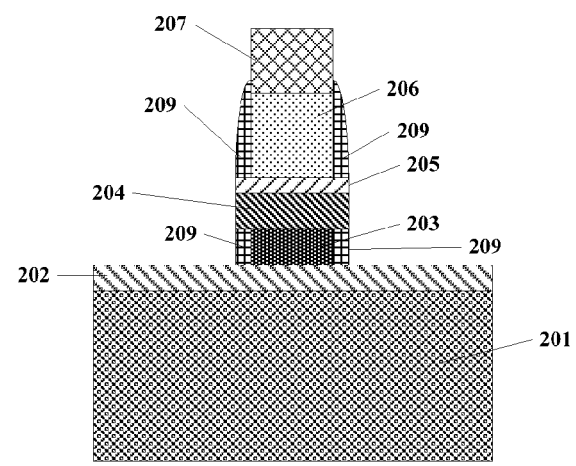
Figure 9B:
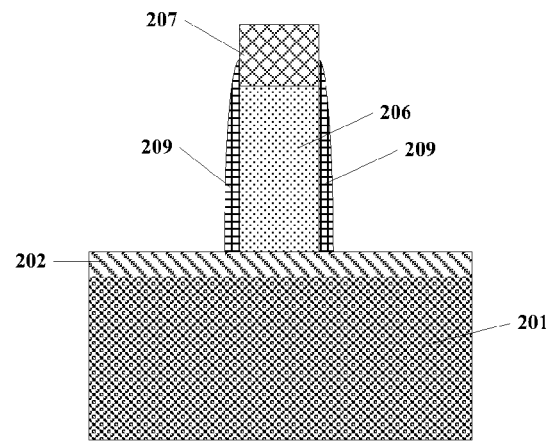

At step S106, a second spacer 209 is formed to cover both sides of the sacrificial layer and expose both sides of the semiconductor layer, as shown in FIG. 9A. FIGS. 9A and 9B are cross-sectional views along the AA' and BB' directions as noted in FIG. 5D, respectively. In some embodiments, the first spacer 208 can be removed before forming second spacer 209. Note that both sides of semiconductor layer 204 are exposed. In some embodiments, first spacer 208 does not need to be removed. The second spacer can be formed using known processes such as deposition of a spacer material followed by an etch process.

Figure 10A:
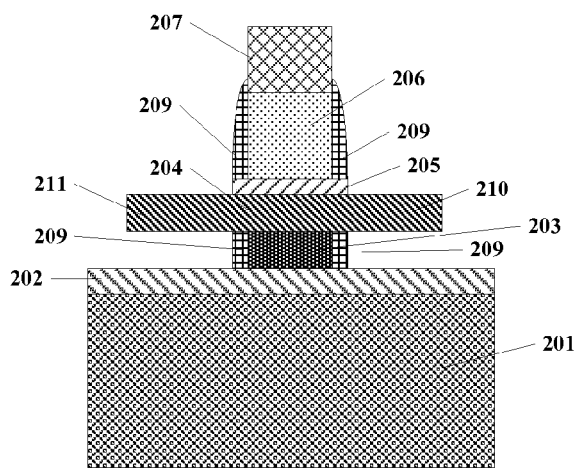
Figure 10B:
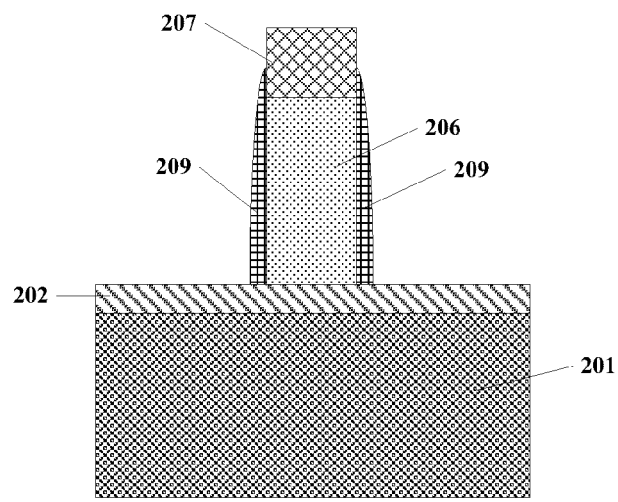
Figure 11:
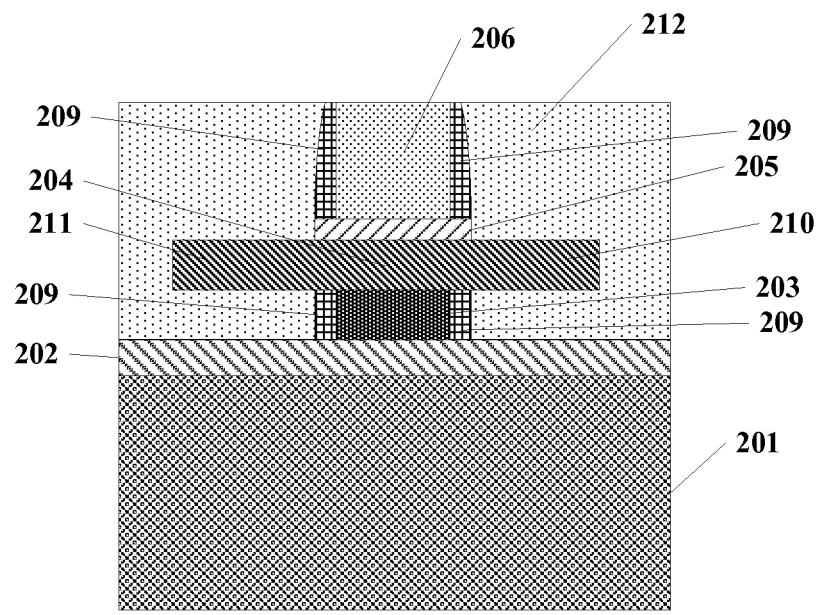

At step S107, an epitaxial growth is performed on both sides of semiconductor layer 204 to form source and drain regions. FIGS. 10A and 10B are cross-sectional views along the AA' and BB' directions as noted in FIG. 5D, respectively. As shown in FIG. 10A, an epitaxial grown material, e.g., Si, SiGe, or SiC, is performed on both sides of semiconductor layer 204 to form a source 210 and a drain region 211. Of course, the source and drain regions can be reversed. Next, an ion implantation process can be carried out to dope the source and drain regions.

Figure 12:
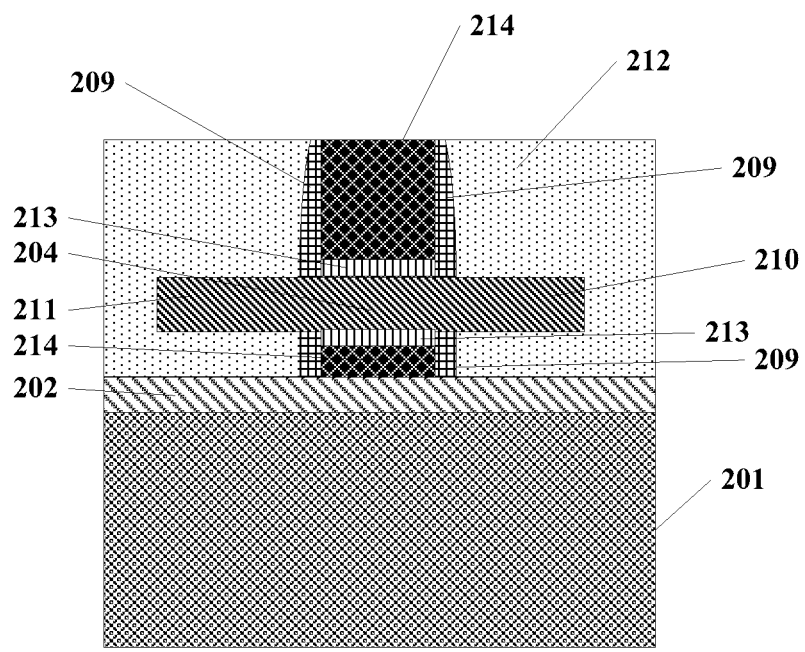

In some embodiments, the method can also include forming an interlayer dielectric around the source and the drain regions, planarizing the interlayer dielectric to expose the dummy gate, removing the dummy gate and the sacrificial layer, and forming a high K dielectric layer and a metal gate surrounding the remaining semiconductor layer. FIGS. 11A and 11B are cross-sectional views along the AA' and BB' directions as noted in FIG. 5D, respectively. As shown in FIG. 11A, an interlayer dielectric layer 212 is formed, e.g., by deposition, and planarized, e.g., by CMP (chemical mechanical polishing), to expose dummy gate 206. In FIG. 12, dummy dielectric 205, dummy gate 206, and sacrificial layer 203 are removed by suitable etch methods. Then, a gate dielectric 213 and a metal gate 214 are formed to complete the high dielectric constant dielectric and metal gate device structure.

In some embodiments of the present invention, isotropic dry etching may be utilized to remove the dummy gate and the sacrificial layer. For example, the dummy gate and the sacrificial layer can be removed by isotropic dry etching using a fluorine-based gas. In other embodiments of the present invention, wet etching or dry etching can be used to etch the dummy gate and a portion of the sacrificial layer, and then an isotropic etching can be used to remove the remaining portion of sacrificial layer. For example, the dummy gate and a portion of the sacrificial layer may be removed by an isotropic plasma etching in a fluorine-based gas, and then a hydrogen chloride gas, at a temperature higher than 200° C., can be used to etch the remaining portion of the sacrificial layer. As another example, a wet etch can be used to remove the dummy gate, and then an isotropic etch can be used to remove the sacrificial layer. For example, a polysilicon dummy gate can be removed using TMAH (tetramethylammonium hydroxide) wet etching, and then an isotropic etching (e.g., wet etching or dry etching) can be used to remove the sacrificial layer. Of course, for the removal of the sacrificial layer, different etching processes may be employed for different materials. For example, in some embodiments, the channel layer material (i.e., the semiconductor layer) is Si, and the sacrificial layer may be a SiGe or Ge. A high temperature (e.g. above 200° C.) HCl (hydrogen chloride) etch can be used to remove a SiGe sacrificial layer, and a hydrogen peroxide can be used to remove the Ge sacrificial layer. In embodiments with a SiGe as the channel layer, the sacrificial layer can be Si or Ge. In this case, a high temperature HCl (hydrogen chloride) etch can be used to remove the Si sacrificial layer, or a hydrogen peroxide solution can be used to remove the Ge sacrificial layer. In embodiments in which the channel layer material is Ge or a III-V group compound and the sacrificial layer material is Si, TMAH can be used to remove the Si sacrificial layer.

Through the production process of the present invention, the nanowire device can be formed with a good interface at the nanowires and the gate junction, thereby improving the gate characteristics of nanowire devices, such as better gate control ability. The nanowire device can be more timely and effectively turned on and off.

Figure 13:
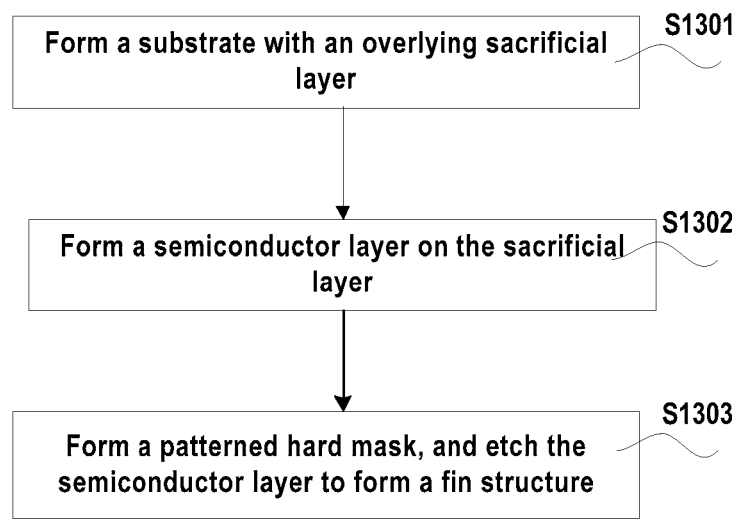

FIG. 13 is a simplified flow chart illustrating a method for forming fin structures according to an embodiment of the present invention. FIGS. 13, 14A, 14B, and 14C are cross-sectional view diagrams illustrating a method for forming fin structures. As shown in FIG. 13, the method includes the following steps:

S1301: forming the sacrificial layer on the substrate;
S1302: forming the semiconductor layer on the sacrificial layer; and
S1303: forming a patterned mask on the semiconductor layer, and etching the semiconductor layer and the sacrificial layer to form a fin structure.

Figure 14A:
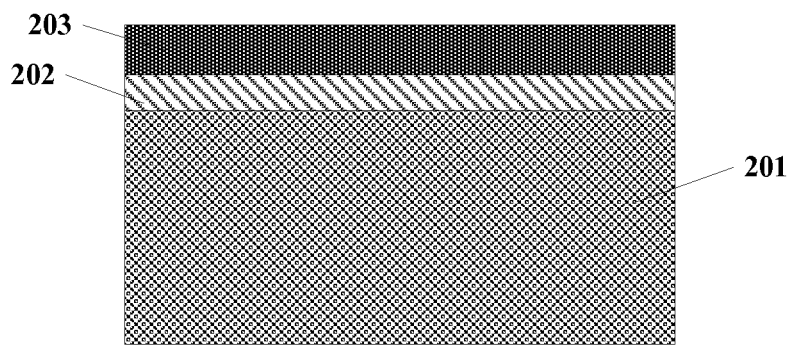

At step S1301, as shown in FIG. 14A, an insulator layer 202 is formed on a substrate 201, and a sacrificial layer 203 is formed on the insulator layer. Thus, FIG. 14A illustrates a semiconductor substrate including a sacrificial layer. In an embodiment, the sacrificial layer is a single crystalline material, e.g., single crystalline SiGe; a Smart Cut process can be used to form the semiconductor substrate. The Smart Cut process is a process for forming a silicon-on-insulator structure, in which a hydrogen implant is used to separate a single crystalline semiconductor layer from a bulk material. In another embodiment, no insulator is used, and an epitaxial process can be used to form sacrificial layer 203 overlying a semiconductor substrate 201. In another embodiment, the sacrificial layer can be a polysilicon material, which can be formed using a deposition process.

Figure 14B:
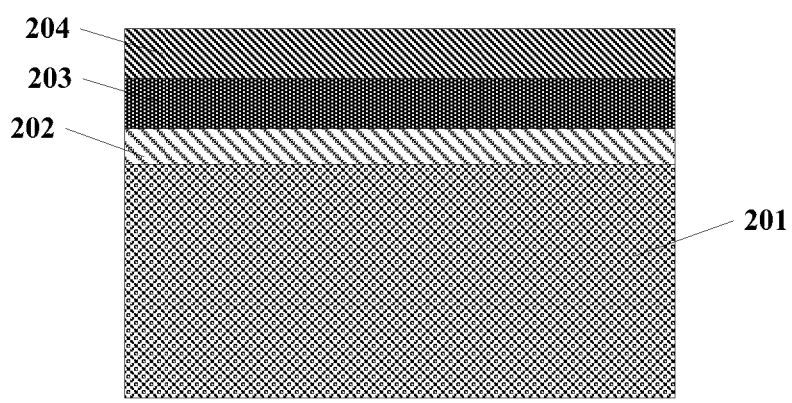

At step S1302, as shown in FIG. 14B, a semiconductor layer 204 is formed on the sacrificial layer. In an embodiment with a single crystalline SiGe sacrificial layer, the semiconductor layer can be formed epitaxially on the sacrificial layer. In an embodiment with a polycrystalline sacrificial layer, the semiconductor layer can be formed on the sacrificial layer using a Smart Cut process.

Figure 14C:
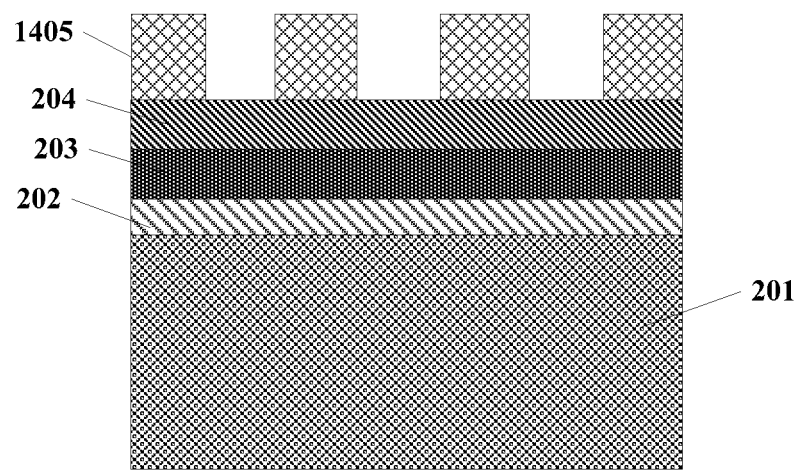

At step S1303, as shown in FIG. 14C, a patterned mask 1405 is formed on the semiconductor layer. Next, the semiconductor layer and the sacrificial layer are etched to form the fin structures (as shown in FIG. 2).

Thus, a manufacturing method of the semiconductor device has been described in detail and according to an embodiment of the present disclosure. In order to maintain clarity of the disclosed concept, certain details known in the art are not described in detail. Those skilled in the art can understand how to implement technical solutions disclosed herein based on the above description.

Unless otherwise indicated, terms such as "first" and "second" are used to distinguish the elements described. Thus, these terms are not necessarily intended to represent the time of these elements or other order. In addition, terms such as "front," "after," "top," "bottom," "upper," and "lower" are used to describe the position in the illustrations and are not intended for describing permanent relative positions permanently.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. A method of forming a semiconductor nanowire device, the method comprising:
    forming a semiconductor substrate having at least one fin structure on an insulator on a substrate, said fin structure including a semiconductor layer overlying a sacrificial layer;
    forming a patterned dummy gate on the substrate;
    forming a first spacer on both sides of the dummy gate;
    using the dummy gate and the first spacer as a mask, removing a portion of the semiconductor layer and the sacrificial layer;

etching the sacrificial layer to form recessed regions on both sides of the sacrificial layer;

forming a second spacer to cover both sides of the sacrificial layer and exposing both sides of the semiconductor layer; and performing epitaxial growth on both sides of the semiconductor layer to form source and drain regions.

2. The method of claim 1, further comprising:

forming an interlayer dielectric around the source and the drain regions;

planarizing the interlayer dielectric to expose the dummy gate;

removing the dummy gate and the sacrificial layer; and forming a high K dielectric layer and a metal gate surrounding the remaining semiconductor layer.

3. The method of claim 2, wherein removing the dummy gate and the sacrificial layer comprises using isotropic dry etching to remove the dummy gate and the sacrificial layer.

4. The method of claim 2, wherein removing the dummy gate and the sacrificial layer comprises:

using wet etching or dry etching to remove the dummy gate and a portion of the sacrificial layer; and using isotropic etching to remove the remaining sacrificial layer.

5. The method of claim 4, further comprising using hydrogen chloride gas at a temperature higher than 200° C. to remove the remaining sacrificial layer.

6. The method of claim 1, further comprising: before forming the patterned dummy gate, forming a dummy insulator on the fin structure.

7. The method of claim 6, wherein the dummy insulator comprises an oxide material or a nitride material.

8. The method of claim 1, wherein forming the patterned dummy gate comprises:

forming a dummy gate material layer on the substrate overlying the insulator and the fin structure;

forming a patterned hard mask on the dummy gate material layer;

using the hard mask as a mask, etching the dummy gate material to form the patterned dummy gate.

9. The method of claim 8, wherein the dummy gate comprises polysilicon or amorphous silicon.

10. The method of claim 8, wherein the hard mask comprises SiN, SiCN, SiC, or SiON.

11. The method of claim 1, wherein the lateral dimension of the sacrificial layer, after recessed regions are formed, is substantially the same as the lateral dimension of the dummy gate.

12. The method of claim 1, further comprising removing the first spacer before forming the second spacer.

13. The method of claim 1, wherein forming the fin structure comprises:

forming the sacrificial layer on the substrate;

forming the semiconductor layer on the sacrificial layer;

forming a patterned mask on the semiconductor layer; and etching the semiconductor layer and the sacrificial layer to form the fin structure.

14. The method of claim 1, wherein the sacrificial layer comprises Si, Ge, or SiGe, and the semiconductor layer comprises Si, SiGe, Ge, or a group III-V compound.

15. The method of claim 1, wherein the source and drain regions comprise Si, SiGe, or SiC.

16. The method of claim 1, wherein the first spacer comprises silicon oxide or amorphous carbon.

* * * * *